United States Patent
Jitsuhara

(12) 
(10) Patent No.: US 7,302,239 B2
(45) Date of Patent: Nov. 27, 2007

(54) WIRELESS RECEIVING DEVICE

(75) Inventor: Tsutomu Jitsuhara, Higashiosaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 943 days.

(21) Appl. No.: 10/351,384

(22) Filed: Jan. 27, 2003

(65) Prior Publication Data

US 2003/0236078 A1    Dec. 25, 2003

(30) Foreign Application Priority Data

Jun. 19, 2002  (JP) .............................. 2002-178295

(51) Int. Cl.
*G06F 3/033* (2006.01)
*H04N 7/16* (2006.01)

(52) U.S. Cl. ................. 455/130; 725/151; 725/153

(58) Field of Classification Search ................. 455/130, 455/296, 300, 301, 3.02, 550.1; 725/81, 725/85, 133, 141, 153, 131, 139, 151
See application file for complete search history.

(56) References Cited

U.S. PATENT DOCUMENTS 5,535,034 A * 7/1996 Taniguchi ................... 398/139
5,880,721 A * 3/1999 Yen .............................. 725/81
6,259,891 B1 * 7/2001 Allen ......................... 455/3.02
6,992,990 B2   1/2006 Sakusabe .................... 370/293
7,089,032 B2 * 8/2006 Hongo et al. .............. 455/550.1

FOREIGN PATENT DOCUMENTS

| JP | 10-197662 | 7/1998 |
|---|---|---|
| JP | 2001-285119 | 10/2001 |
| JP | 2001-313576 | 11/2001 |
| JP | 2002-033676 | 1/2002 |

* cited by examiner

*Primary Examiner*—Chris Kelley
*Assistant Examiner*—Gayla Futel
(74) *Attorney, Agent, or Firm*—Nixon & Vanderhye, PC

(57) ABSTRACT

A wireless receiving device of the present invention is so arranged that (i) a high-frequency circuit section is provided on a front surface of a printed board and (ii) a digital video signal processing section and a wireless LAN digital signal processing section are provided on a back surface of the printed board. Further, an earth pattern is provided in a middle position between the front and back surfaces of the printed board, so that (i) the high-frequency circuit section and (ii) the digital video signal processing section and the wireless LAN digital signal processing section are shielded from one another using electromagnetic shielding by the earth pattern. Thus, when members that are commonly used for the wireless LAN and for wireless video reception are formed on a single printed board in order to reduce the size of the printed board, it is possible to effectively reduce the lowering of signal quality caused by the noise.

13 Claims, 4 Drawing Sheets

WIRELESS RECEIVING DEVICE

FIELD OF THE INVENTION

The present invention relates to a wireless receiving device for receiving a wireless video picture and a wireless LAN signal.

BACKGROUND OF THE INVENTION

FIG. 4 is a block circuit diagram schematically showing a conventional wireless video system. A conventional wireless video system 140 in FIG. 4 is composed of a wireless video transmitting device 141 and a wireless video receiving device 142. The wireless video transmitting device 141 is composed of a wireless video transmitter 153 and an antenna 154. The wireless video receiving device 142 is composed of an antenna 155 and a wireless video receiver 156.

A video tape recorder (VTR) 152, etc., for example, is connected to an input side of the wireless video transmitter 153, whereas the antenna 154 is connected to an output side of the wireless video transmitter 153. Further, the antenna 155 is connected to an input side of the wireless video receiver 156, whereas a personal computer (PC) 157 and a monitor 158, for example, are connected to an output side of the wireless video receiver 156.

Next, operation of the conventional wireless video system 140 in FIG. 4 will be explained. On a wireless video transmitter 153 side, a video signal P and an audio signal S that are outputted from the video tape recorder (VTR) 152 are converted into a high-frequency signal RF by the wireless video transmitter 153, and the high-frequency signal RF is then transmitted to the wireless video receiver 156 via the antenna 154.

On a wireless video receiver 156 side, the high-frequency signal RF that is transmitted from the wireless video transmitter 153 is received at the antenna 155. The received high-frequency signal RF is converted back into the original video signal P and the audio signal S by the wireless video receiver 156. The video signal P and the audio signal S are supplied to an AV input terminal of the personal computer (PC), and are displayed on the monitor 158.

As described above, by employing the wireless video system 140, it is possible to view a video picture and hear sound of the video tape recorder (VTR) 152, etc., for example, on the personal computer (PC) 157, etc., for example, which is remotely located from the video tape recorder (VTR) 152, etc. Further, by connecting an outdoor antenna to the video tape recorder (VTR) 152 and selecting television broadcasting on the video tape recorder (VTR) 152 so that the video tape recorder (VTR) 152 outputs the video signal P and the audio signal S of the selected television broadcasting, it is possible to view the television broadcasting on the personal computer (PC) 157 even at an indoor place where the reception of a television signal is not good.

Further, in order to transmit the video signal P and the audio signal S from the wireless video transmitter 153 to the wireless video receiver 156 as the high-frequency signal RF, a spread spectrum technique is used for 2.4 GHz, for example, of a frequency band of the high-frequency signal RF. A general communication method employing the spread spectrum technique is as follows. On a transmitting side, an input baseband signal such as the video signal P and the audio signal S is modulated, and subjected to the spread spectrum using a spread code, so as to be transmitted as the high-frequency signal RF. The spread spectrum signal that is received on a receiving side is demodulated (reverse spread spectrum) into the original signal such as the video signal P and the audio signal S, using the same spread code as the spread code on the transmitting side. Further, when wireless LAN is used on the personal computer, the same spread spectrum technique is used for the 2.4 GHz band.

However, in the conventional technique, for displaying the video signal P and the audio signal S on the personal computer, the analog video signal has to be converted back into the digital video signal at the personal computer, thereby enlarging a processing circuit on a personal computer side.

Further, wireless signals may be mutually interfered when the wireless LAN and the wireless video receiver are simultaneously used on the personal computer.

Further, when respective circuits that are commonly used for the wireless LAN and for the wireless video receiver are provided on a printed board in a small size, in order to use the wireless receiving device both as the wireless LAN receiver and the wireless video receiver, the mutual interference of the signals between the respective circuits, the entrance of a signal of a circuit into the other circuit, etc. cause the signal loss and error rate deterioration of communication signals. This causes a problem in which a video picture, sound, and wireless LAN data cannot be transmitted and received in a good condition.

SUMMARY OF THE INVENTION

The object of the present invention is to provide a wireless receiving device capable of effectively reducing the lowering of signal quality caused by noise, even when members that are commonly used for wireless LAN and for wireless video reception are provided on a printed board in order to reduce the size of the printed board.

In order to attain the foregoing object, a wireless receiving device of the present invention is characterized by including a printed board on which (a) a high-frequency circuit section for converting a received high-frequency signal into an analog signal, (b) an analog signal switching section for switching the analog signal from the high-frequency circuit section into first and second analog signals, (c) a first baseband processing circuit section for converting the first analog signal into a video data baseband signal, (d) a second baseband processing circuit section for converting the second analog signal into a wireless LAN baseband signal, (e) a digital video signal processing section for converting the baseband signal into a digital video signal, (f) a wireless LAN digital signal processing section for converting the baseband signal into a wireless LAN digital signal, and (g) an interface circuit section for outputting the digital video signal and the wireless LAN digital signal are provided, the high-frequency circuit section being provided on a front surface of the printed board, and the digital video signal processing section and the wireless LAN digital signal processing section being provided on a back surface of the printed board.

With this arrangement, the high-frequency circuit section is provided on the front surface of the printed board, and the digital video signal processing section and the wireless LAN digital signal processing section are provided on the back surface of the printed board. As a result, (i) the high-frequency circuit section and (ii) the digital video signal processing section and the wireless LAN digital signal processing section are separately provided on the front and back surfaces of the printed board. This effectively reduces the entrance of the digital signal noise, which is emitted from the digital video signal processing section and the wireless LAN digital signal processing section, into the high-frequency circuit section. Thus, when members that are commonly used for the wireless LAN and for wireless video reception are formed on the single printed board in order to reduce the size of the printed board, it is possible to effectively reduce the lowering of signal quality caused by the noise.

Namely, by effectively reducing the mutual interference of the signals between the respective circuits, the entrance of a signal and noise of a circuit into the other circuit, etc., so as to prevent the signal loss and error rate deterioration of communication signals, it is possible to provide a wireless video system capable of receiving a video picture, sound, and wireless LAN data in a good condition.

In order to attain the foregoing object, the wireless receiving device of the present invention, wherein the printed board has a multilayer structure of three or more layers which are respectively indicated by a first layer, a second layer, . . . , and an n-th layer (n is a positive integer), where 2≦a (an integer)≦(n−1), is characterized in that an outer surface of the first layer is the front surface, an earth pattern is formed at an a-th layer; and an outer surface of the n-th layer is the back surface.

With this arrangement, the earth pattern is formed at the a-th layer between the first layer and the n-th layer. Namely, the earth pattern is provided in a middle position between the front and back surfaces of the printed board. Thus, (i) the high-frequency circuit section and (ii) the digital video signal processing section and the wireless LAN digital signal processing section can be shielded from one another using electromagnetic shielding by the earth pattern. In addition to the effect of the above-mentioned arrangement, this further improves the effect of separating the circuits that are respectively provided on the front and back surfaces of the printed board, thereby effectively reducing the interference between the respective circuits, such as the entrance of the digital signal noise, which is emitted from the digital video signal processing section and the wireless LAN digital signal processing section, into the high-frequency circuit section.

For a fuller understanding of the nature and advantages of the invention, reference should be made to the ensuing detailed description taken in conjunction with the accompanying drawings.

BRIEF DESCRIPTION OF THE DRAWINGS

FIG. 1(a) shows a front surface of the printed board, whereas FIG. 1(b) shows a back surface of the printed board.

DESCRIPTION OF THE EMBODIMENTS

The following will explain an embodiment of the present invention with reference to FIGS. 1(a), 1(b), 2, and 3.

The present embodiment is a wireless receiving device for receiving a wireless LAN (Local Area Network) signal and for receiving a wireless video picture at a personal computer.

Figure 2:
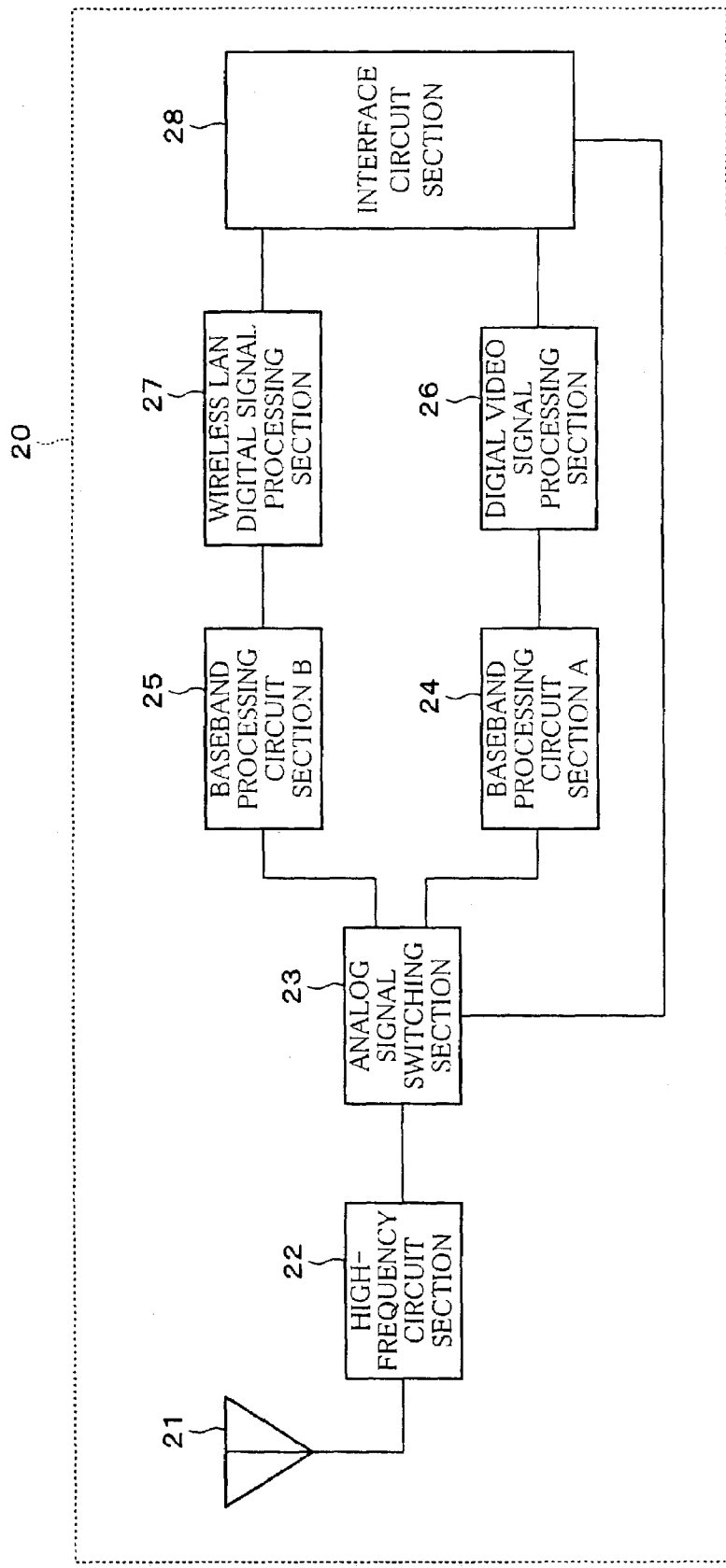
FIG. 2 is a block circuit diagram schematically showing an example of an arrangement of the wireless receiving device of the present invention.

FIG. 2 schematically shows an arrangement of a wireless receiving device 20 of the present embodiment. The wireless receiving device 20 is composed of an antenna section 21, a high-frequency circuit section 22, an analog signal switching section 23, a baseband processing circuit section A 24 (first baseband processing circuit section), a baseband processing circuit section B 25 (second baseband processing circuit section), a digital video signal processing section 26, a wireless LAN digital signal processing section 27, and an interface circuit section 28.

The antenna section 21 is connected to an input side of the high-frequency circuit section 22. An output side of the high-frequency circuit section 22 is connected, via the analog signal switching section 23, to respective input sides of the baseband processing circuit section A 24 and the baseband processing circuit section B 25. Further, the baseband processing circuit section A 24 is connected to the digital video signal processing section 26, whereas the baseband processing circuit section B 25 is connected to the wireless LAN digital signal processing section 27. The digital video signal processing section 26 and the wireless LAN digital signal processing section 27 are connected to the interface circuit section 28. Digital video data or wireless LAN data are transmitted to the personal computer (not shown) via the interface circuit section 28.

The antenna section 21, which is provided in the wireless receiving device 20, is a connector of an antenna. The antenna section 21 is provided on a printed board 40.

The interface circuit section 28 transmits a signal to the interface 29 shown in FIGS. 1(a) and 1(b). The interface 29 is a connection terminal to the personal computer.

A wireless video receiver is composed of the high-frequency circuit section 22, the analog signal switching section 23, the baseband processing circuit section A 24, the digital video signal processing section 26, and the interface circuit section 28.

On the other hand, a wireless LAN signal receiver is composed of the high-frequency circuit section 22, the analog signal switching section 23, the baseband processing circuit section B 25, the wireless LAN digital signal processing section 27, and the interface circuit section 28.

Next, operation of the wireless receiving device 20 of the present embodiment will be explained with reference to FIG. 2. When the wireless receiving device 20 functions as the wireless video receiver, a high-frequency signal that is sent from a wireless video transmitter such as the wireless video transmitter 153 is received at the antenna section 21. The received high-frequency signal is converted into an analog signal in a packet form by the high-frequency circuit section 22. The analog signal in the packet form is supplied to the baseband processing circuit section A 24 by the analog signal switching section 23, so as to be converted into a baseband signal in a packet form. The baseband signal in the packet form is converted into a compressed digital video signal by the digital video signal processing section 26. The compressed digital video signal is supplied to the interface circuit section 28, and converted so as to be in conformity to an interface of the personal computer, and data are transferred to the personal computer. On the personal computer side, using software for video reproduction, a video picture is displayed on a monitor of the personal computer, and sound is outputted from a speaker.

On the other hand, when the wireless receiving device 20 functions as the wireless LAN signal receiver, the interface circuit section 28 controls the switching of the analog signal switching section 23 so that the analog signal switching section 23 outputs to the baseband processing circuit section B 25, the analog signal that is sent from the high-frequency circuit section 22. With this, the wireless LAN digital signal processing section 27 generates wireless LAN data, and the wireless LAN data are transferred to the personal computer via the interface circuit section 28.

FIGS. 1(a) and 1(b) respectively show layouts of the respective circuits on the printed board 40 in the wireless receiving device 20 of the present embodiment. FIG. 1(a) shows one planar surface (front surface) of the printed board 40, whereas FIG. 1(b) shows the other planar surface (back surface) of the printed board 40. Next, the layouts of the respective circuits on the printed board 40 in the wireless receiving device 20 of the present embodiment will be explained with reference to FIGS. 1(a) and 1(b).

In FIGS. 1(a) and 1(b), the circuit configuration of the wireless receiving device 20, which is explained with reference to FIG. 2, is separately provided on the front and back surfaces of the printed board 40 having a substantially quadrangular shape.

As shown in FIG. 1(a), the antenna section 21, the high-frequency circuit section 22, the analog signal switching section 23, and the baseband processing circuit section A 24 are provided on one planar surface (front surface) of the printed board 40. As shown in FIG. 1(b), the baseband processing circuit section B 25, the digital video signal processing section 26, the wireless LAN digital signal processing section 27, and the interface circuit section 28 are provided on the other planar surface (back surface) of the printed board 40.

On the front surface of the printed board 40, the high-frequency circuit section 22 is provided to be adjacent to a first edge 31 of the printed board 40.

Further, an area on the front surface of the printed board 40 is divided into two parts (into two equal parts, for example). The high-frequency circuit section 22 is provided on a side of the first edge 31 of the printed board 40, whereas the analog signal switching section 23 and the baseband processing circuit section A 24 are provided on a side of a third edge 33 of the printed board 40, which is opposite to the first edge 31.

Further, on the back surface of the printed board 40, the digital video signal processing section 26 is provided to be adjacent to a second edge 32 and the third edge 33 of the printed board 40, and the wireless LAN digital signal processing section 27 is provided to be adjacent to the first edge 31 and a fourth edge 34 of the printed board 40.

Further, on the back surface of the printed board 40, the interface circuit section 28 is provided to be adjacent to the third edge 33 and the fourth edge 34 of the printed board 40. Further, on the back surface of the printed board 40, the baseband processing circuit section B 25 is provided to be adjacent to the first edge 31 and the second edge 32 of the printed board 40.

Further, on the back surface of the printed board 40, the interface 29 to the personal computer is provided on the fourth edge 34 of the printed board 40. On the front surface of the printed board 40, the antenna section 21, which is the connector of the antenna, is provided on the second edge 32 of the printed board 40, which is opposite to the fourth edge 34.

Further, the printed board 40 may be a multilayer board (having six layers, for example), whose intermediate layer (a third layer, for example) is provided with an earth pattern which is a metal pattern for the connection between a ground section and the respective circuit sections. This satisfies a relation of $1<a<n$, where the layer number of the intermediate layer at which the earth pattern is provided is a (an integer), and the total number of the layers in the printed board 40 is n (a positive integer).

Further, the printed board 40 may be a multilayer board (having six layers, for example), whose intermediate layer (a fourth layer, for example) is provided with a power supply pattern which is a metal pattern for the connection between a power supply and the respective circuit sections to which the power is supplied. This satisfies a relation of $1<b<n$, where the layer number of the intermediate layer at which the power supply pattern is provided is b (an integer), and the total number of the layers in the printed board 40 is n (a positive integer).

Further, the printed board 40 may be a multilayer board (having six layers, for example), whose intermediate layer (a second layer, for example) is provided with a signal pattern for the high-frequency circuit section 22. This satisfies a relation of $1<c<n$, where the layer number of the intermediate layer at which the signal pattern for the high-frequency circuit section 22 is provided is c (an integer), and the total number of the layers in the printed board 40 is n (a positive integer).

Further, the printed board 40 may be a multilayer board (having six layers, for example), whose intermediate layer (a fifth layer, for example) is provided with a signal pattern for the interface circuit section 28. This satisfies a relation of $1<d<n$, where the layer number of the intermediate layer at which the signal pattern for the interface circuit section 28 is provided is d (an integer), and the total number of the layers in the printed board 40 is n (a positive integer).

Further, the printed board 40 may be a multilayer board (having six layers, for example), whose intermediate layer is provided with a signal pattern for the digital video signal processing section 26 and a signal pattern for the wireless LAN digital signal processing section 27. This satisfies a relation of $1<e<n$, where the layer number of the intermediate layer at which the signal pattern for the digital video signal processing section 26 and the signal pattern for the wireless LAN digital signal processing section 27 are provided is e (an integer), and the total number of the layers in the printed board 40 is n (a positive integer).

Figure 3:
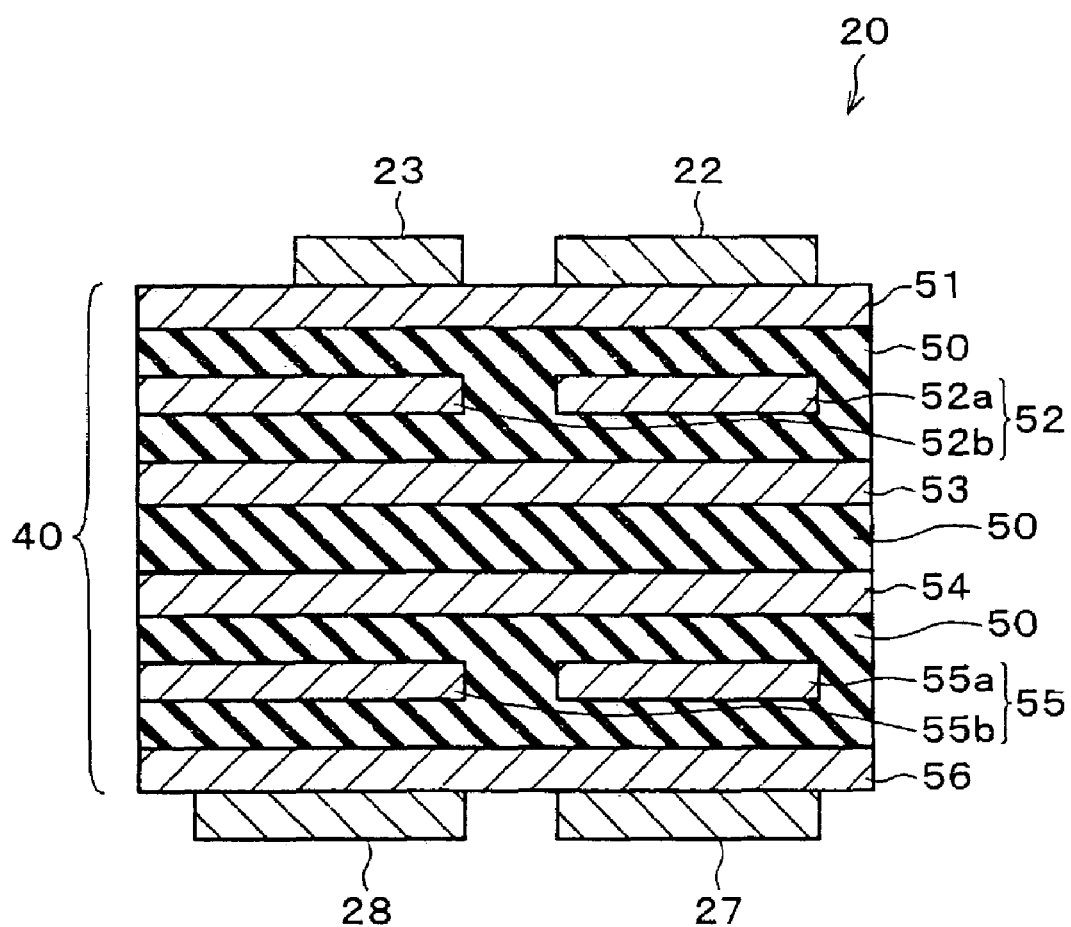
FIG. 3 is a cross-sectional view taken on the arrow of FIG. 1(a).
Figure 4:
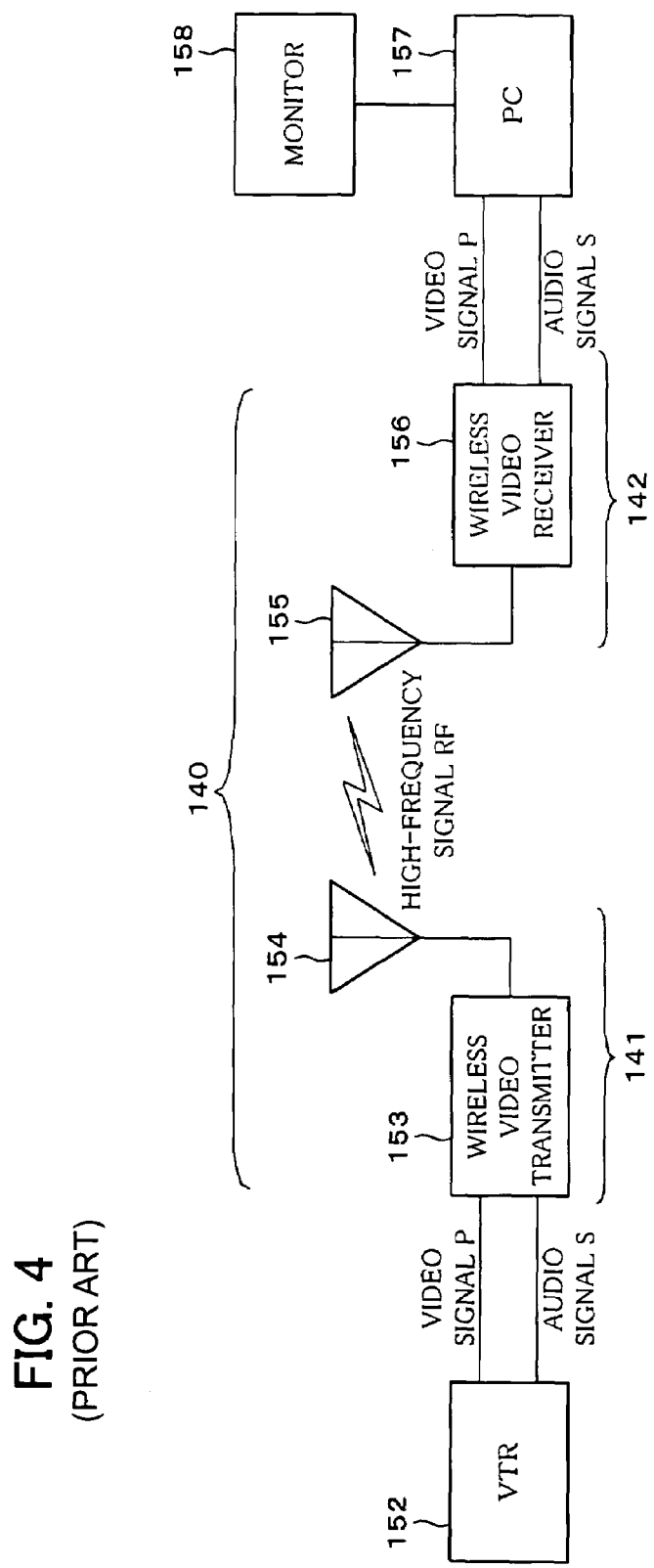
FIG. 4 is a block circuit diagram schematically showing an example of an arrangement of a conventional wireless video system.

The following will explain the above-described arrangement. FIG. 3 is a cross-sectional view taken on the arrow of FIG. 1(a). The printed board 40 has a multilayer structure. More specifically, one or more intermediate layers (second layer through (n−1)th layer) are provided between an outermost layer (first layer) on a front side and an outermost layer (n-th layer) on a back side. The layers are respectively separated by an insulation layer 50. The layers except the insulation layer 50 are respectively indicated by the first layer, the second layer, . . . , and the n-th layer sequentially in their layered order from the front side (n is a positive integer). In this example, the printed board 40 has six layers (n=6). The first layer 51 through the sixth layer 56 are made of metal.

The first layer 51 is a layer that is exposed to the outside on the front surface side. The high-frequency circuit section 22, the analog signal switching section 23, the baseband processing circuit section A 24, and the antenna section 21 are provided on an outer surface of the first layer 51.

The second layer 52 is composed of an area 52a and an area 52b. The area 52a is located to face the high-frequency circuit section 22. The signal pattern of the high-frequency circuit section 22 is provided in the area 52a. The area 52b is located to face the analog signal switching section 23. The signal pattern of the analog signal switching section 23 is provided in the area 52*b*.

The third layer 53 is provided with the earth pattern.

The fourth layer 54 is provided with the power supply pattern.

The fifth layer 55 is composed of an area 55*a* and an area 55*b*. The area 55*a* is located to face the wireless LAN digital signal processing section 27. The signal pattern of the wireless LAN digital signal processing section 27 is provided in the area 55*a*. The area 55*b* is located to face the interface circuit section 28. The signal pattern of the interface circuit section 28 is provided in the area 55*b*.

The sixth layer 56 is a layer that is exposed to the outside on the back surface side. The wireless LAN digital signal processing section 27, the interface circuit section 28, the digital video signal processing section 26, and the baseband processing circuit section B 25 are provided on an outer surface of the sixth layer 56.

As described above, the earth pattern (the third layer 53), the power supply pattern (the fourth layer 54), and the respective signal patterns (the second layer 52, the fifth layer 55) are respectively provided at different intermediate layers here. However, the earth pattern, the power supply pattern, and the respective signal patterns may be respectively provided at any intermediate layer in any order.

Figure 1:
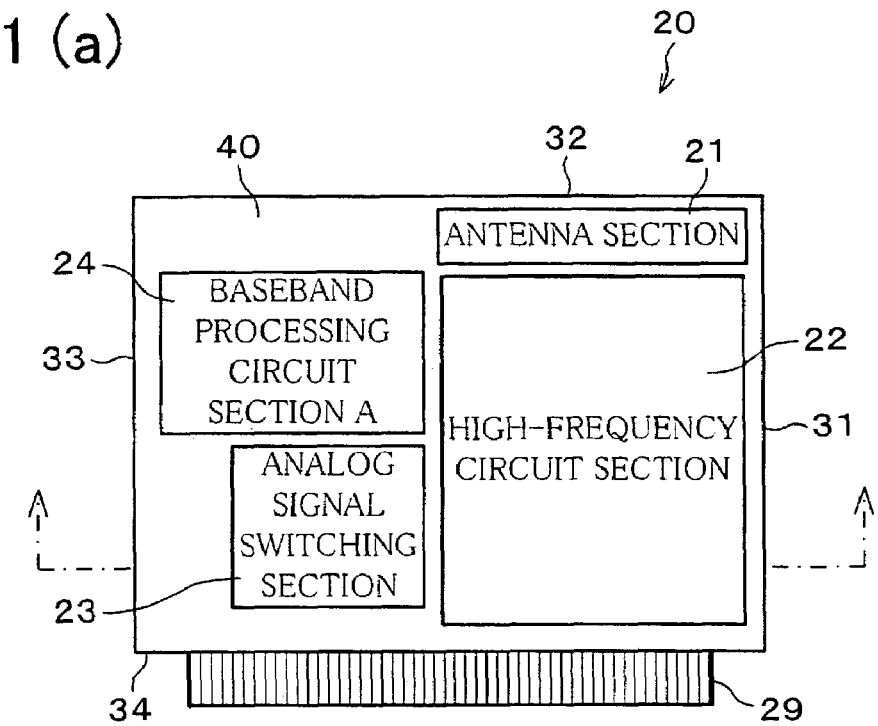
FIGS. 1(a) and 1(b) are plan views showing a layout example of respective circuits on a printed board in a wireless receiving device of the present invention.
Figure 1:
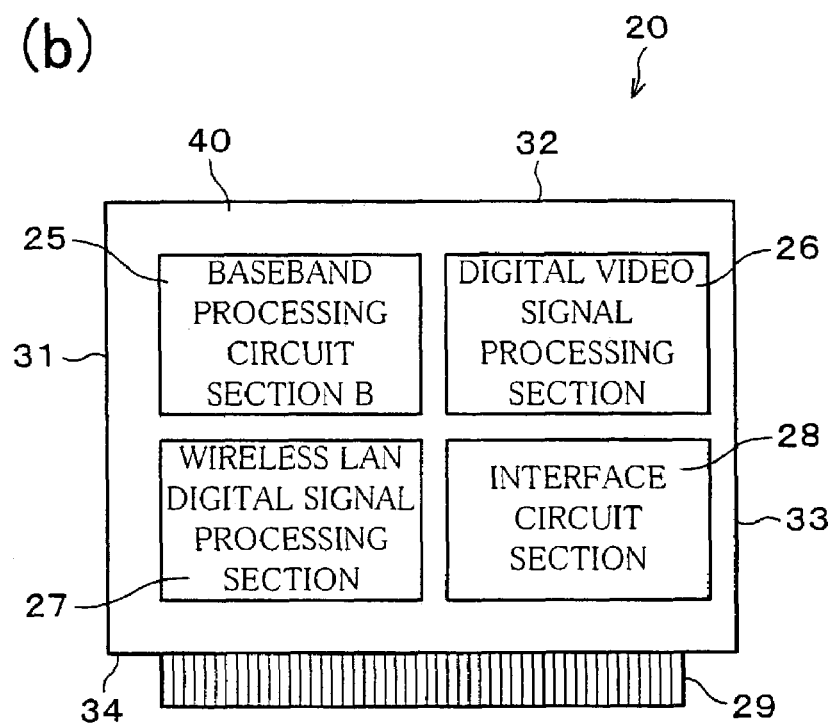

The structure as shown in FIGS. 1(*a*), 1(*b*), and 3 may be manufactured using a known technique of manufacturing a semiconductor circuit in which kinds of signal patterns and circuits are layered on the printed board 40.

As described above, in the present embodiment, the high-frequency circuit section 22 is provided on the front surface of the printed board 40, and the digital video signal processing section 26 and the wireless LAN digital signal processing section 27 are provided on the back surface of the printed board 40. This effectively reduces the entrance of the digital signal noise, which is emitted from the digital video signal processing section 26 and the wireless LAN digital signal processing section 27, into the high-frequency circuit section 22. Thus, when members that are commonly used for the wireless LAN and for wireless video reception are formed on the single printed board 40 in order to reduce the size of the printed board 40, it is possible to effectively reduce the lowering of signal quality caused by the noise.

As described above, in order to use the circuits commonly for the wireless LAN and for the wireless video receiver, the respective circuits are separated per circuit block, and the respective circuit blocks are provided on the printed board in the elaborate manner. This reduces the mutual interference of the signals between the respective circuits, the entrance of a signal of a circuit into the other circuit, etc., thereby preventing the signal loss and error rate deterioration of communication signals. With this, it is possible to provide a wireless video transmitting and receiving system capable of receiving a video picture, sound, and wireless LAN data in a good condition.

A wireless video system of the present invention may be arranged so as to include (a) a high-frequency circuit section for converting into an analog signal, a high-frequency signal that is sent from a wireless video transmitter, (b) an analog signal switching section for switching into first and second analog signals of two kinds of baseband processing circuit sections, the analog signal that is sent from the high-frequency circuit section, (c) a baseband processing circuit section A for converting into a video data baseband signal, the first analog signal that is sent from the analog signal switching section, (d) a baseband processing circuit section B for converting into a wireless LAN baseband signal, the second analog signal that is sent from the analog signal switching section, (e) a digital video signal processing section for converting into a digital video signal, the baseband signal that is sent from the baseband processing circuit section A, (f) a wireless LAN digital signal processing section for converting into a wireless LAN digital signal, the baseband signal that is sent from the baseband processing circuit section B, and (g) an interface circuit section for interfacing the digital video signal and the wireless LAN digital signal with a personal computer, (A) the high-frequency circuit section, the analog signal switching section, and the baseband processing circuit section A being provided on one planar surface of the printed board, and (B) the digital video signal processing section, the wireless LAN digital signal processing section, and the interface circuit section being provided on the other planar surface of the printed board.

Further, on a front surface of the printed board, the high-frequency circuit section may be arranged so to be adjacent to a first edge of the printed board.

Further, on a back surface of the printed board, the digital video signal processing section may be arranged so as to be adjacent to a second edge and a third edge of the printed board, and the wireless LAN digital signal processing section may be arranged so as to be adjacent to the first edge and a fourth edge of the printed board.

Further, on the back surface of the printed board, the interface circuit section may be arranged so as to be adjacent to the third edge and the fourth edge of the printed board.

Further, on the back surface of the printed board, an interface to a personal computer may be arranged to be on the fourth edge of the printed board; and on the front surface of the printed board, an antenna section (connector of an antenna) may be arranged to be on the second edge of the printed board, which is opposite to the fourth edge.

Further, on the front surface of the printed board, by dividing an area on the front surface into two parts, the high-frequency circuit section may be arranged to be on a side of the first edge of the printed board, whereas the baseband processing circuit section A may be arranged to be on a side of the third edge of the printed board, which is opposite to the first edge.

Further, the printed board may be a multilayer board in which one of intermediate layers is provided with an earth pattern, so as to reduce interference between the high-frequency circuit section on the front surface of the printed board and the interface circuit section on the back surface of the printed board. Further, the printed board may be a multilayer board having six layers in which the earth pattern is provided at a third layer.

Namely, (A) the high-frequency circuit section and the baseband processing circuit section A which are provided on the front surface layer and (B) the digital video signal processing section, the wireless LAN digital signal processing section, and the interface circuit section which are provided on the back surface layer are shielded from one another using electromagnetic shielding by the earth pattern that is provided at the intermediate layer. This further improves the effect of separating the circuits that are respectively provided on the front and back surfaces of the printed board. More specifically, (i) the high-frequency circuit section and (ii) the digital video signal processing section and the wireless LAN digital signal processing section which process a digital signal are separately provided on the front and back surfaces of the printed board; and (i) and (ii) are shielded from one another using the electromagnetic shielding by the earth pattern. This effectively reduces the entrance of the digital signal noise, which is emitted from the digital video signal processing section and the wireless LAN digital signal processing section, into the high-frequency circuit section. As described above, by effectively reducing the mutual interference of the signals between the respective circuits, the entrance of a signal and noise of a circuit into the other circuit, etc., so as to prevent the signal loss and error rate deterioration of communication signals, it is possible to provide a wireless video system capable of receiving a video picture, sound, and wireless LAN data in a better condition.

Further, the printed board may be a multilayer board in which one of intermediate layers is provided with a power supply pattern, so as to reduce interference between the high-frequency circuit section on the front surface of the printed board and the interface circuit section on the back surface of the printed board. Further, the printed board may be a multilayer board having six layers in which the power supply pattern is provided at a fourth layer.

Namely, (A) the high-frequency circuit section and the baseband processing circuit section A which are provided on the front surface layer and (B) the digital video signal processing section, the wireless LAN digital signal processing section, and the interface circuit section which are provided on the back surface layer are shielded from one another using electromagnetic shielding by the power supply pattern, which is provided at the intermediate layer, for the connection between the power supply and the respective circuit sections to which the power is supplied. This further improves the effect of separating the circuits that are respectively provided on the front and back surfaces of the printed board. More specifically, (i) the high-frequency circuit section and (ii) the digital video signal processing section and the wireless LAN digital signal processing section which process a digital signal are separately provided on the front and back surfaces of the printed board; and (i) and (ii) are shielded from one another using the electromagnetic shielding by the power supply pattern. This effectively reduces the entrance of the digital signal noise, which is emitted from the digital video signal processing section and the wireless LAN digital signal processing section, into the high-frequency circuit section. As described above, by effectively reducing the mutual interference of the signals between the respective circuits, the entrance of a signal and noise of a circuit into the other circuit, etc., so as to prevent the signal loss and error rate deterioration of communication signals, it is possible to provide a wireless video system capable of receiving a video picture, sound, and wireless LAN data in a better condition.

Further, at least one of intermediate layers, which are sandwiched between the intermediate layer at which the earth pattern is provided and the back surface layer, may be provided with the power supply pattern for the connection between the power supply and the respective circuit sections to which the power is supplied.

With this arrangement, (i) the high-frequency circuit section and (ii) the digital video signal processing section and the wireless LAN digital signal processing section which process a digital signal are separately provided on the front and back surfaces of the printed board; and (i) and (ii) are doubly shielded from one another using electromagnetic shielding by both of the earth pattern and the power supply pattern that is provided at the intermediate layer. This further improves the effect of separating the circuits that are respectively provided on the front and back surfaces of the printed board. More specifically, (i) the high-frequency circuit section and (ii) the digital video signal processing section and the wireless LAN digital signal processing section which process a digital signal are separately provided on the front and back surfaces of the printed board; and (i) and (ii) are doubly shielded from one another using the electromagnetic shielding by both of the earth pattern and the power supply pattern. This effectively reduces the entrance of the digital signal noise, which is emitted from the digital video signal processing section and the wireless LAN digital signal processing section, into the high-frequency circuit section. As described above, by effectively reducing the mutual interference of the signals between the respective circuits, the entrance of a signal and noise of a circuit into the other circuit, etc., so as to prevent the signal loss and error rate deterioration of communication signals, it is possible to provide a wireless video system capable of receiving a video picture, sound, and wireless LAN data in a better condition.

Further, at least one of intermediate layers, which are sandwiched between the intermediate layer at which the earth pattern is provided and the back surface layer, may be provided with a signal pattern for the digital video signal processing section which processes a digital signal and a signal pattern for the wireless LAN digital signal processing section which processes a digital signal.

With this arrangement, by providing at the intermediate layer, the signal patterns for the digital video signal processing section which processes a digital signal and for the wireless LAN digital signal processing section which processes a digital signal, it is possible to reduce the digital signal noise that is emitted from the signal patterns.

Further, the printed board may be a multilayer board in which one of intermediate layers is provided with a signal pattern for the high-frequency circuit section. Further, the printed board may be a multilayer board having six layers in which the signal pattern for the high-frequency circuit section is provided at a second layer.

Namely, (A) the high-frequency circuit section and the baseband processing circuit section A which are provided on the front surface layer and (B) the digital video signal processing section, the wireless LAN digital signal processing section, and the interface circuit section which are provided on the back surface layer are shielded from one another using electromagnetic shielding by the signal pattern for the high-frequency circuit section, which is provided at the intermediate layer. This further improves the effect of separating the circuits that are respectively provided on the front and back surfaces of the printed board. More specifically, (i) the high-frequency circuit section and (ii) the digital video signal processing section and the wireless LAN digital signal processing section which process a digital signal are separately provided on the front and back surfaces of the printed board; and (i) and (ii) are shielded from one another using the electromagnetic shielding by the signal pattern for the high-frequency circuit section. This effectively reduces the entrance of the digital signal noise, which is emitted from the digital video signal processing section and the wireless LAN digital signal processing section, into the high-frequency circuit section. As described above, by effectively reducing the mutual interference of the signals between the respective circuits, the entrance of a signal and noise of a circuit into the other circuit, etc., so as to prevent the signal loss and error rate deterioration of communication signals, it is possible to provide a wireless video system capable of receiving a video picture, sound, and wireless LAN data in a better condition.

Further, the printed board may be a multilayer board in which one of intermediate layers is provided with a signal pattern for the interface circuit section. Further, the printed board may be a multilayer board having six layers in which the signal pattern for the interface circuit section is provided at a fifth layer.

Namely, (A) the high-frequency circuit section and the baseband processing circuit section A which are provided on the front surface layer and (B) the digital video signal processing section, the wireless LAN digital signal processing section, and the interface circuit section which are provided on the back surface layer are shielded from one another using electromagnetic shielding by the signal pattern for the interface circuit section, which is provided at the intermediate layer. This further improves the effect of separating the circuits that are respectively provided on the front and back surfaces of the printed board. More specifically, (i) the high-frequency circuit section and (ii) the digital video signal processing section and the wireless LAN digital signal processing section which process a digital signal are separately provided on the front and back surfaces of the printed board; and (i) and (ii) are shielded from one another using the electromagnetic shielding by the signal pattern for the interface circuit section. This effectively reduces the entrance of the digital signal noise, which is emitted from the digital video signal processing section and the wireless LAN digital signal processing section, into the high-frequency circuit section. As described above, by effectively reducing the mutual interference of the signals between the respective circuits, the entrance of a signal and noise of a circuit into the other circuit, etc., so as to prevent the signal loss and error rate deterioration of communication signals, it is possible to provide a wireless video system capable of receiving a video picture, sound, and wireless LAN data in a better condition.

Further, the wireless video system may be so arranged that a frequency band of a high-frequency signal is 2.4 GHz, and a spread spectrum technique is employed.

As described above, a wireless receiving device of the present invention is arranged so as to include a printed board on which (a) a high-frequency circuit section for converting a received high-frequency signal into an analog signal, (b) an analog signal switching section for switching the analog signal from the high-frequency circuit section into first and second analog signals, (c) a first baseband processing circuit section for converting the first analog signal into a video data baseband signal, (d) a second baseband processing circuit section for converting the second analog signal into a wireless LAN baseband signal, (e) a digital video signal processing section for converting the baseband signal into a digital video signal, (f) a wireless LAN digital signal processing section for converting the baseband signal into a wireless LAN digital signal, and (g) an interface circuit section for outputting the digital video signal and the wireless LAN digital signal are provided, the high-frequency circuit section being provided on a front surface of the printed board, and the digital video signal processing section and the wireless LAN digital signal processing section being provided on a back surface of the printed board.

With this arrangement, the high-frequency circuit section is provided on the front surface of the printed board, and the digital video signal processing section and the wireless LAN digital signal processing section are provided on the back surface of the printed board. As a result, (i) the high-frequency circuit section and (ii) the digital video signal processing section and the wireless LAN digital signal processing section are separately provided on the front and back surfaces of the printed board. This effectively reduces the entrance of the digital signal noise, which is emitted from the digital video signal processing section and the wireless LAN digital signal processing section, into the high-frequency circuit section. Thus, when members that are commonly used for the wireless LAN and for wireless video reception are formed on the single printed board in order to reduce the size of the printed board, it is possible to effectively reduce the lowering of signal quality caused by the noise.

Namely, by effectively reducing the mutual interference of the signals between the respective circuits, the entrance of a signal and noise of a circuit into the other circuit, etc., so as to prevent the signal loss and error rate deterioration of communication signals, it is possible to provide a wireless video system capable of receiving a video picture, sound, and wireless LAN data in a good condition.

In addition to the above arrangement, the wireless receiving device of the present invention, wherein the printed board has a multilayer structure of three or more layers which are respectively indicated by a first layer, a second layer, . . . , and an n-th layer (n is a positive integer), where $2 \leq a$ (an integer) $\leq (n-1)$, is so arranged that an outer surface of the first layer is the front surface, an earth pattern is formed at an a-th layer; and an outer surface of the n-th layer is the back surface.

With this arrangement, the earth pattern is formed at the a-th layer between the first layer and the n-th layer. Namely, the earth pattern is provided in a middle position between the front and back surfaces of the printed board. Thus, (i) the high-frequency circuit section and (ii) the digital video signal processing section and the wireless LAN digital signal processing section can be shielded from one another using electromagnetic shielding by the earth pattern. In addition to the effect of the above-mentioned arrangement, this further improves the effect of separating the circuits that are respectively provided on the front and back surfaces of the printed board, thereby effectively reducing the interference between the respective circuits, such as the entrance of the digital signal noise, which is emitted from the digital video signal processing section and the wireless LAN digital signal processing section, into the high-frequency circuit section.

In addition to the above arrangement, the wireless receiving device of the present invention, wherein the printed board has a multilayer structure of three or more layers which are respectively indicated by a first layer, a second layer, . . . , and an n-th layer (n is a positive integer), where $2 \leq b$ (an integer) $\leq (n-1)$, is so arranged that an outer surface of the first layer is the front surface, a power supply pattern is formed at a b-th layer, and an outer surface of the n-th layer is the back surface.

With this arrangement, the power supply pattern is formed at the b-th layer between the first layer and the n-th layer. Namely, the power supply pattern is provided in a middle position between the front and back surfaces of the printed board. Thus, (i) the high-frequency circuit section and (ii) the digital video signal processing section and the wireless LAN digital signal processing section can be shielded from one another using electromagnetic shielding by the power supply pattern. In addition to the effect of the above-described arrangement, this further improves the effect of separating the circuits that are respectively provided on the front and back surfaces of the printed board, thereby effectively reducing the interference between the respective circuits, such as the entrance of the digital signal noise, which is emitted from the digital video signal processing section and the wireless LAN digital signal processing section, into the high-frequency circuit section.

In addition to the above arrangement, the wireless receiving device of the present invention, wherein the printed board has a multilayer structure of three or more layers which are respectively indicated by a first layer, a second layer, . . . , and an n-th layer (n is a positive integer), where $2 \leq c$ (an integer) $\leq (n-1)$, is so arranged that an outer surface of the first layer is the front surface, a signal pattern of the high-frequency circuit section is formed at a c-th layer, and an outer surface of the n-th layer is the back surface.

With this arrangement, the signal pattern of the high-frequency circuit section is formed at the c-th layer between the first layer and the n-th layer. Namely, the signal pattern of the high-frequency circuit section is provided in a middle position between the front and back surfaces of the printed board. Thus, (i) the high-frequency circuit section and (ii) the digital video signal processing section and the wireless LAN digital signal processing section can be shielded from one another using electromagnetic shielding by the signal pattern of the high-frequency circuit section. In addition to the effect of the above-mentioned arrangement, this further improves the effect of separating the circuits that are respectively provided on the front and back surfaces of the printed board, thereby effectively reducing the interference between the respective circuits, such as the entrance of the digital signal noise, which is emitted from the digital video signal processing section and the wireless LAN digital signal processing section, into the high-frequency circuit section.

In addition to the above arrangement, the wireless receiving device of the present invention, wherein the interface circuit section is provided on the back surface of the printed board, the printed board having a multilayer structure of three or more layers which are respectively indicated by a first layer, a second layer, . . . , and an n-th layer (n is a positive integer), where $2 \leq d$ (an integer)$\leq (n-1)$, is so arranged that an outer surface of the first layer is the front surface, a signal pattern of the interface circuit section is formed at a d-th layer, and an outer surface of the n-th layer is the back surface.

With this arrangement, the interface circuit section is provided on the back surface of the printed board; and the signal pattern of the interface circuit section is formed at the d-th layer between the first layer and the n-th layer. Namely, the signal pattern of the interface circuit section is provided in a middle position between the front and back surfaces of the printed board. Thus, (i) the high-frequency circuit section and (ii) the digital video signal processing section and the wireless LAN digital signal processing section can be shielded from one another using electromagnetic shielding by the signal pattern of the interface circuit section. In addition to the effect of the above-mentioned arrangement, this further improves the effect of separating the circuits that are respectively provided on the front and back surfaces of the printed board, thereby effectively reducing the interference between the respective circuits, such as the entrance of the digital signal noise into the high-frequency circuit section, the digital signal noise being emitted from the digital video signal processing section, the wireless LAN digital signal processing section, and the interface circuit section.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A wireless receiving device, comprising a printed board on which (a) a high-frequency circuit section for converting a received high-frequency signal into an analog signal, (b) an analog signal switching section for switching the analog signal from said high-frequency circuit section into first and second analog signals, (c) a first baseband processing circuit section for converting the first analog signal into a video data baseband signal, (d) a second baseband processing circuit section for converting the second analog signal into a wireless LAN baseband signal, (e) a digital video signal processing section for converting the baseband signal into a digital video signal, (f) a wireless LAN digital signal processing section for converting the baseband signal into a wireless LAN digital signal, and (g) an interface circuit section for outputting the digital video signal and the wireless LAN digital signal are provided, said high-frequency circuit section being provided on a front surface of said printed board; and
said digital video signal processing section and said wireless LAN digital signal processing section being provided on a back surface of said printed board.

2. The wireless receiving device as set forth in claim 1, wherein:

said analog signal switching section and said first baseband processing circuit section are further provided on said front surface of said printed board; and
said second baseband processing circuit section and said interface circuit section are further provided on said back surface of said printed board.

3. The wireless receiving device as set forth in claim 1, further comprising an antenna section provided on said printed board, said antenna section being further provided on said front surface of said printed board.

4. The wireless receiving device as set forth in claim 1, wherein said printed board has a multilayer structure of three or more layers which are respectively indicated by a first layer, a second layer, . . . , and an n-th layer (n is a positive integer), where $2 \leq a$ (an integer)$\leq (n-1)$, wherein:

an outer surface of the first layer is said front surface;
an earth pattern is formed at an a-th layer; and
an outer surface of the n-th layer is said back surface.

5. The wireless receiving device as set forth in claim 4, wherein:

at least one of layers, which are sandwiched between the a-th layer at which the earth pattern is formed and the n-th layer, is provided with a power supply pattern.

6. The wireless receiving device as set forth in claim 4, wherein:

at least one of layers, which are sandwiched between the a-th layer at which the earth pattern is formed and the n-th layer, is provided with a signal pattern of said digital video signal processing section and a signal pattern of said wireless LAN digital signal processing section.

7. The wireless receiving device as set forth in claim 1, wherein said printed board has a multilayer structure of three or more layers which are respectively indicated by a first layer, a second layer, . . . , and an n-th layer (n is a positive integer), where $2 \leq b$ (an integer)$\leq (n-1)$, wherein:

an outer surface of the first layer is said front surface;
a power supply pattern is formed at a b-th layer; and
an outer surface of the n-th layer is said back surface.

8. The wireless receiving device as set forth in claim 1, wherein said printed board has a multilayer structure of three or more layers which are respectively indicated by a first layer, a second layer, . . . , and an n-th layer (n is a positive integer), where $2 \leq c$ (an integer)$\leq (n-1)$, wherein:

an outer surface of the first layer is said front surface;
a signal pattern of said high-frequency circuit section is formed at a c-th layer; and
an outer surface of the n-th layer is said back surface.

9. The wireless receiving device as set forth in claim 1, wherein said interface circuit section is provided on said back surface of said printed board, said printed board having a multilayer structure of three or more layers which are respectively indicated by a first layer, a second layer, . . . , and an n-th layer (n is a positive integer), where $2 \leq d$ (an integer)$\leq (n-1)$, wherein:

an outer surface of the first layer is said front surface;

a signal pattern of said interface circuit section is formed at a d-th layer; and an outer surface of the n-th layer is said back surface.

10. The wireless receiving device as set forth in claim 1, wherein said printed board has a multilayer structure of three or more layers which are respectively indicated by a first layer, a second layer, . . . , and an n-th layer (n is a positive integer), where $2 \leq e$ (an integer)$\leq (n-1)$, wherein:

an outer surface of the first layer is said front surface;

a signal pattern of said digital video signal processing section and a signal pattern of said wireless LAN digital signal processing section are formed at an e-th layer; and an outer surface of the n-th layer is said back surface.

11. The wireless receiving device as set forth in claim 1, wherein said printed board has a multilayer structure of three or more layers, wherein:

an earth pattern, a power supply pattern, a signal pattern of said high-frequency circuit section, and a signal pattern of said interface circuit section are respectively formed at different layers.

12. The wireless receiving device as set forth in claim 1, wherein said printed board has a multilayer structure of three or more layers, and the layers are respectively separated by an insulation layer.

13. The wireless receiving device as set forth in claim 1, wherein said printed board has a multilayer structure of three or more layers which are respectively indicated by a first layer, a second layer, . . . , and an n-th layer (n is a positive integer), wherein:

the first through n-th layers are made of metal.

* * * * *